(12) United States Patent
Kuang et al.

(10) Patent No.: US 6,975,134 B2
(45) Date of Patent: Dec. 13, 2005

(54) BUFFER/DRIVER CIRCUITS

(75) Inventors: Jente B. Kuang, Austin, TX (US); Hung C. Ngo, Austin, TX (US); Kevin J. Nowka, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 10/821,048

(22) Filed: Apr. 8, 2004

(65) Prior Publication Data

US 2005/0225352 A1    Oct. 13, 2005

(51) Int. Cl.[7] .......................................... H03K 17/16
(52) U.S. Cl. ......................... 326/27; 326/24; 326/81; 326/83; 326/86
(58) Field of Search ....................... 326/21–24, 26–29, 326/81, 83, 86, 112, 119, 121, 93, 95, 98

(56) References Cited

U.S. PATENT DOCUMENTS

| | | | |
|---|---|---|---|
| 5,497,105 A | * | 3/1996 | Oh et al. ....................... 326/27 |
| 6,100,729 A | * | 8/2000 | Nagano et al. ............. 327/112 |
| 6,198,308 B1 | * | 3/2001 | Morrill ........................ 326/83 |
| 6,650,152 B2 | * | 11/2003 | Kawabata ................... 327/112 |

OTHER PUBLICATIONS

Rafik S. Guindi et al. "Design Techniques for Gate-Leakage Reduction in CMOS in Circuits," *IEEE*, 2003, 5 pages.

* cited by examiner

*Primary Examiner*—Vibol Tan
(74) *Attorney, Agent, or Firm*—Richard F. Frankeny; Winstead Sechrest & Minick P.C.; Casimer K. Salys

(57) ABSTRACT

A buffer/driver having large output devices for driving multiple loads is configured with three parallel paths. The first logic path is made of small devices and is configured to provide the logic function of the buffer/driver without the ability to drive large loads. Second and third logic paths have the logic function of the first logic path up to the last inverting stage. The last inverting stage in each path is a single device for driving the logic states of the buffer output. The second and third logic paths have power-gating that allows the input to the pull-up and pull-down devices to float removing gate-leakage voltage stress. When the second and third logic paths are power-gated, the first logic path provides a keeper function to hold the logic state of the buffer output. The buffer/driver may be an inverter, non-inverter, or provide a multiple input logic function.

16 Claims, 9 Drawing Sheets

BUFFER/DRIVER CIRCUITS

GOVERNMENT RIGHTS

This invention was made with Government support under NBCH30390004 awarded by DEFENSE ADVANCED RESEARCH PROJECT AGENCY. The Government has certain rights in this invention.

TECHNICAL FIELD

The present invention relates in general to complementary metal oxide semiconductor (CMOS) circuits and, in particular, to circuit methodologies for reducing leakage in sub-100 nm technologies.

BACKGROUND INFORMATION

Oxide tunneling current in metal oxide silicon (MOS) field effect transistors (FET) is a non-negligible component of power consumption as gate oxides get thinner, and may in the future become the dominant leakage mechanism in sub-100 nm complementary MOS (CMOS) circuits. The gate current is dependent on various conditions and three main static regions of operation may be identified for a MOSFET. The amount of gate-leakage current differs by several orders of magnitude from one region to another. Whether a transistor leaks significantly or not is also affected by its position in relation to other transistors within a CMOS circuit structure as this affects the voltage stress two which a particular device is subjected.

The three region of operation are a function of applied bias if one only considers the parameters that affect the magnitude of gate-current in a MOSFET as it operates in relation to other MOSFETs. Assuming that the supply voltage (Vdd) and the threshold voltage (Vt) are fixed, then a MOSFET in a static CMOS logic gate operates in one to the three regions, each with a significantly different amount of gate leakage.

The first region is called "strong inversion" and is the region where a MOSFET operates with the absolute value of the gate to source voltage (|VGS|) equal to Vdd. The gate-leakage current density for an N channel FET (NFET) in strong inversion may be as high as 103 amperes (A)/square centimeter ($cm^2$) for an oxide thickness of 1.5 nanometers (nm) at Vdd equal to 3 volts (V). For such a thin oxide, a more realistic value for Vdd is 1.2 V, in which case the gate-leakage current would more likely be 20 A/$cm^2$.

The second region is called the "threshold" region where |VGS|=Vt. A MOSFET operating in the threshold region will leak significantly less than one operating in the strong inversion region, typically 3 to 6 orders of magnitude less depending on Vdd and the oxide thickness.

The third region is called the "Off" region where |VGS|=0.0 V. For an NFET operating in the Off region, there is no leakage if the drain voltage (Vd)=0.0 V. However if Vd is equal to Vdd, then a small leakage current in the reverse direction (drain to gate) may be present due to gate-drain overlap area. Of course this current depends on transistor geometry and is typically 10 orders of magnitude less than the gate-leakage current in the strong inversion region.

The above three regions represent three distinct conditions or states for the channel of a MOSFET. Whether an "ON" transistor operates at strong inversion or at threshold is determined by its position inside a logic circuit structure as well as by the state of other transistors in the circuit structure.

Both NFETS and P channel FETS (PFETS) in a logic circuit structure operate in one of the three regions described above. However, the main tunneling current in a PFET device in strong inversion is due to hole tunneling from the valence band and the main tunneling current in an NFET device in strong inversion is due to electron tunneling from the conduction band. Because of this, PFET gate currents are about 10 times smaller that equivalent sized NFET devices. This fact is important in assessing gate-leakage in a static CMOS circuit.

Since gate leakage currents are measured as current density, it follows that the gate-leakage current in a MOSFET is directly proportional to the gate area (width times length). Transistor sizing, therefore, has a direct impact on the amount of gate-leakage in a CMOS logic circuit.

As CMOS circuits become smaller, leakage current that results when voltage is applied to the gate of the field effect transistors becomes a significant portion of the power dissipation. Leakage power may become the limiting factor in how small devices may be manufactured. As devices are made smaller, the power supply voltage is correspondingly reduced. However, this may not achieve an adequate reduction in leakage power dissipation. Alternate techniques are being employed to reduce leakage power. One popular technique is to use power-gating to isolate the power supply voltage in groups of circuits at controlled times. These circuits are sometimes referred to as being part of a power-gated domain. Other circuits may be evaluating a logic function and may not be in a power-gated domain. Interfacing between circuits in a power-gated domain and circuits in a non-power-gated domain may prove difficult. The state of an output from a power-gated domain maybe be uncertain during the time period of power-gating. While the benefits of power-gating are known, there is no consensus on strategies to preserve logic states of outputs in the power-gated domains. Since power-gated domains may be variable, the method of preserving output logic states from circuits in a power-gated domain are controlled by the power-gating control signals themselves.

The current drive capability of a CMOS buffer/driver depends on the channel size of devices used to drive outputs or to drive many other logic gate inputs. Therefore, one would expect the large devices to exhibit large gate-leakage current when the technology has gate oxides that are very thin. Likewise, logic regions with a high number of logic gates may exhibit a large gate-leakage current due to the large number of devices that are in strong inversion at any one static time (between clock transitions). Logic regions with a high number of logic gates may employ power supply gating whereby the power to the logic devices are decoupled by the action MOSFETs, PFETs for the positive power supply voltage and NFETs for the negative power supply voltage. These regions where power supply gating is employed is sometimes referred to as "cuttable" regions. When a cuttable region is interfaced with a non-cuttable region, then logic states at the interface outputs may become indeterminate when power is decoupled. Typically a power gating is applied to a block of circuits which makes it difficult to provide timing control of the power gating.

There is, therefore, a need for a circuit design for a buffer/driver that enables cuttable regions to interface with non cuttable regions with the buffer/driver to be set into a low leakage state to save leakage current while enabling the logic state at the interface to be maintained. Further there is a need for a circuit design that allows power gating to be applied on a per line basis rather than to a large block of circuits.

SUMMARY OF THE INVENTION

A buffer/driver topology for interfacing power-gated and non power-gated circuitry employs three parallel circuit paths. One path comprises two small area inverters in series between the buffer/driver input and output. A first parallel path has a first input coupled to the buffer/driver input and a first output coupled to the buffer/driver output. The first parallel path comprises a first inverter with power-gating applied to the negative power supply voltage. The output of the first inverter is coupled to a PFET which is a large device used to provide current for pulling the buffer/driver output quickly to the positive power supply voltage level. The source of the PFET is coupled to the positive power supply voltage and the drain of the PFET is coupled to the buffer/driver output. Likewise, the second parallel path comprises a second inverter with power-gating applied to the positive power supply voltage. The output of the second inverter is coupled to an NFET which is a large device used to provide current for pulling the buffer/driver output quickly to the negative power supply voltage level. The source of the NFET is coupled to ground and the drain of the NFET is coupled to the buffer/driver output. When the first and second inverters are power-gated, the two small area inverters maintain the logic state of the buffer/driver output. Since the devices in the small area inverters are small devices, they may be configured to have low leakage. The large NFET and PFET coupled to the output have their gates "floated" when the first and second inverters are power-gated, thus reducing the high leakage current of these devices. Additional configurations allow circuitry where only the pull down or pull up devices are large and employ power-gating. The non power-gated level is set by the first and second inverter string. Other embodiments utilize more than two inverting stages in series wherein the first stage may be multi-input inverting logic stage.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
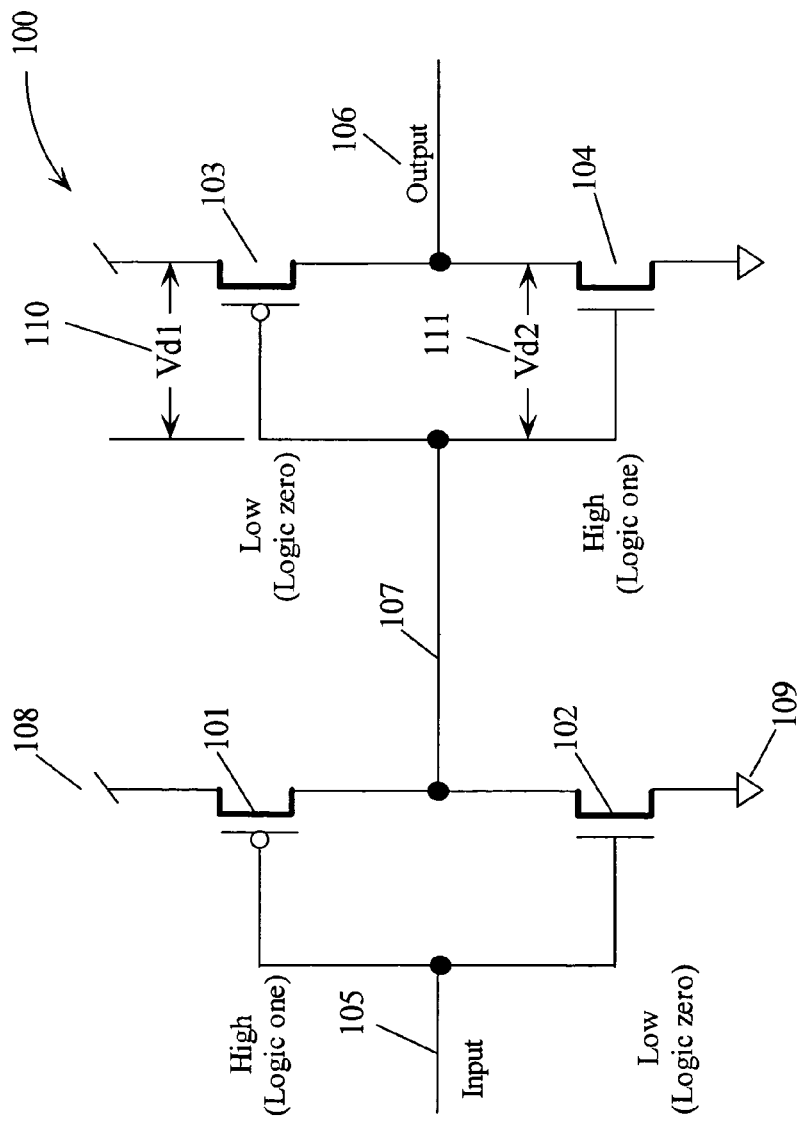
FIG. 1 is a circuit diagram of a prior art buffer illustrating the normal voltage stress that leads to leakage currents.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 1 is a circuit diagram of a prior art non-inverting buffer 100 comprising two inverting stages. Buffer 100 is coupled to positive power supply voltage (Vdd) 108 and negative or ground power supply voltage 109. When input 105 is a logic one PFET 101 is OFF and NFET 102 is ON. Intermediate node 107 is a logic zero. When node 107 is a logic zero, voltage Vd1 110 develops across the source to gate of PFET 103. PFET 103 is in the strong inversion region where it will exhibit its highest gate-leakage current. Vd1 110 is very nearly equal to the supply voltage differing only by the magnitude of the voltage across NFET 102 when it is ON. Likewise, when input 105 is a logic zero, PFET 101 is ON, charging node 107 to a logic one generating Vd2 111 across the gate to source of NFET 104. When node 107 is a logic one, NFET 104 is in the strong inversion region and will exhibit its highest gate-leakage current. Again, Vd2 111 is very nearly equal to Vdd 108. In a normal buffer design, buffer 100 would employ larger devices for PFET 103 and NFET 104 as these stages provide the output drive capabilities. While PFET 101 and NFET 102 both alternatively operate in the strong inversion region depending on the logic state of input 105, as smaller devices they will exhibit lower gate-leakage than PFET 103 and NFET 104, respectively.

Figure 2:
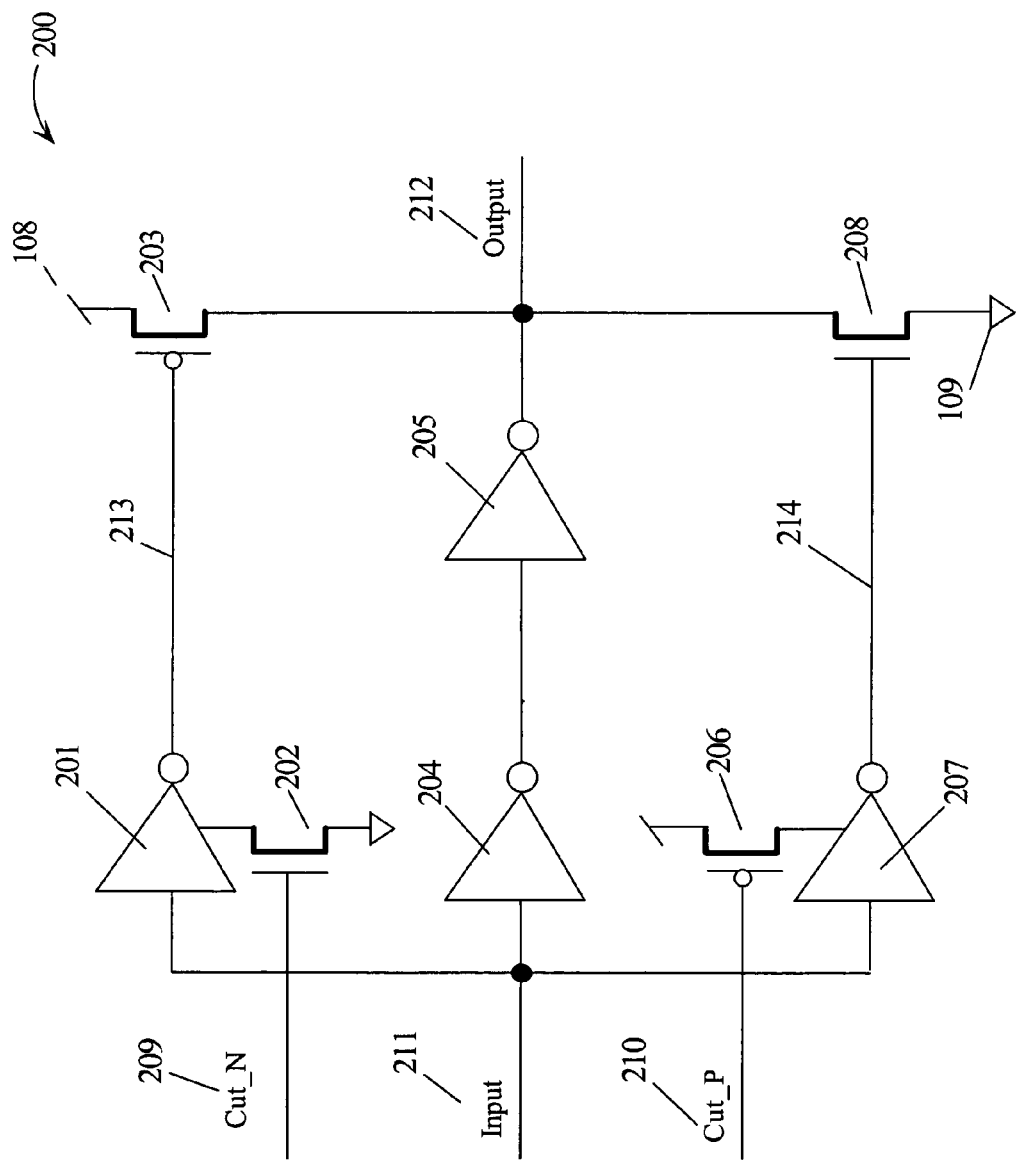
FIG. 2 is a circuit diagram of a buffer/driver according to embodiments of the present invention.

FIG. 2 is a circuit diagram of a buffer/driver 200 according to embodiments of the present invention. Buffer/driver 200 has an output stage comprising PFET 203 and NFET 208 in parallel with output inverter 205. PFET 203 is gated ON and OFF by the voltage level on node 213 driven by inverter 201. Inverter 201 has power supply gating applied to the ground voltage via NFET 202. NFET 202 is turned ON and OFF with control signals Cut_N 209. The input of inverter 201 is coupled to input 211. If input 211 is a logic one, then node 213 can only be driven to a logic zero if Cut_N 209 is a logic one turning ON NFET 202. IF Cut_N 209 is a logic zero and input 211 is a logic one, then node 213 "floats" reducing the voltage stress on PFET 203 that produces gate-leakage current.

NFET 208 is gated ON and OFF by the voltage level on node 214 driven by inverter 207. Inverter 207 has power supply gating applied to the positive voltage via PFET 206. PFET 206 is turned ON and OFF with control signal Cut_P 210. The input of inverter 207 is coupled to input 211. If input 211 is a logic zero, then node 214 can only be driven to a logic one if Cut_P 210 is a logic zero turning ON PFET 206. IF Cut_P 210 is a logic one and input 211 is a logic zero, then node 214 "floats" reducing the stress on NFET 208.

Inverter 204 and inverter 205 provide the same function as the parallel combination of inverters 201, 207, and PFET 203 and NFET 208 when Cut_N 209 is a logic one and Cut_P 210 is a logic zero. PFET 203 and NFET 208 provide the path for high drive capability for output 212. However, if inverter 201 and inverter 207 are power-gated (via control signals Cut_N 209 and Cut_P 210), inverters 204 and 205 hold the proper logic level on output 212 as nodes 213 or 214 float, reducing the stress on PFET 203 and NFET 208.

Figure 3:
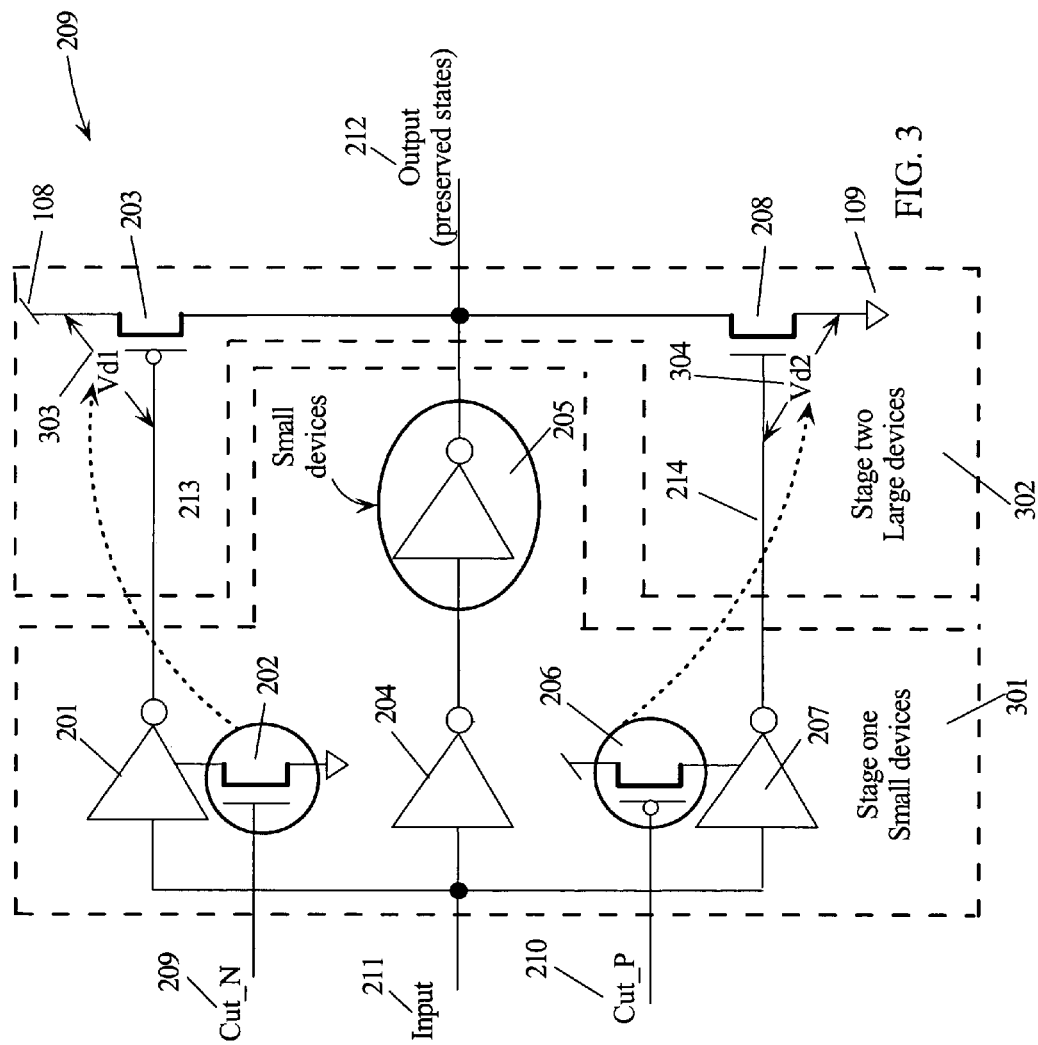
FIG. 3 is the circuit diagram of FIG. 2 with illustrations concerning device sizes and circuit states.

FIG. 3 is the circuit diagram of FIG. 2 with added illustrations concerning device sizing. Inverters 204 and 205 receive input 211 and generate output 212 while providing a "keeper" function. Since these inverters are not counted on to provide the dynamic current necessary to drive loads coupled to output 212, they both comprise small FET devices with reduced gate-leakage when operated in the strong inversion region. Inverters 201 and 207 are also small as they only drive the gates of PFET 203 and NFET 208, respectively. NFET 202 provides the conduction path to pull-down node 213 when gated ON by Cut_N 209. NFET 202 is also smaller than NFET 208 since it drives only the gate of PFET 203. PFET 206 provides the conduction path to pull-up node 214 when gated ON by Cut_P 210. PFET 206 is smaller than PFET 203 since it also drives only the gate of a single NFET 208. Vd1 303 and Vd2 304 are very nearly equal to the power supply voltage Vdd 108. Buffer/driver 200 may be partitioned as an output stage 302 with large FET devices and an input stage 301 with small, low leakage FET devices.

Figure 4:
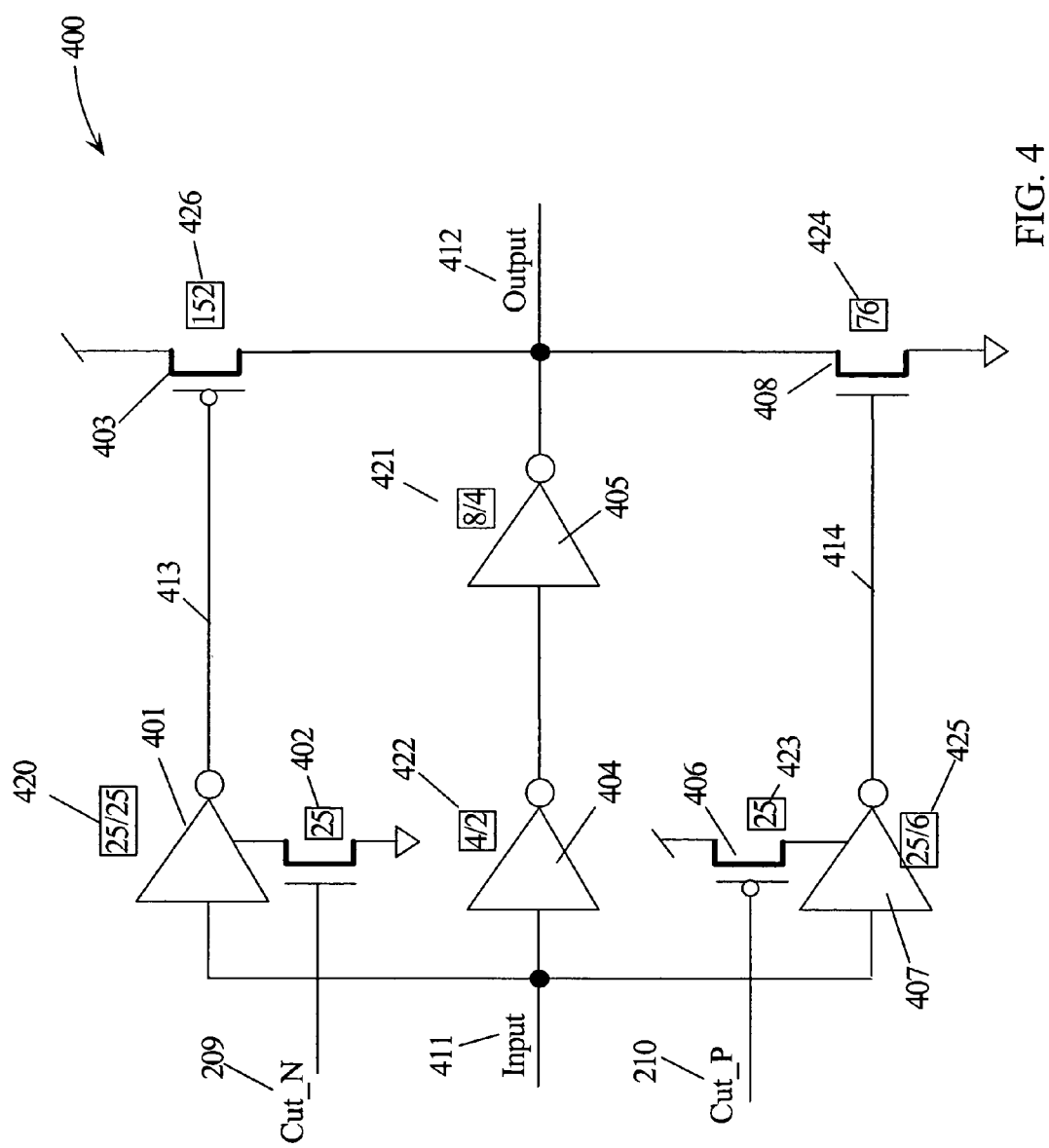
FIG. 4 is another circuit diagram of the circuit of FIG. 2 with more specific relative device sizes.

FIG. 4 is a circuit diagram which illustrates sizes of FET devices for a buffer/driver 400. Since drive capability of FET devices is proportional to the channel width, the devices in buffer/driver 400 are shown normalized to device channel widths in units (a unit is approximately ⅛ of a micron), for example, a device with a channel width of 50 units is shown simply as 50. For logic devices, the device channel size (ChS) is shown as the ratio of the P-channel device channel size relative to the N-channel device size. Since an N-channel is approximately twice as conductive (carrier mobility's) as a P-channel, equivalent current carrying characteristics are realized when a P-channel is approximately twice as wide as an N-channel.

Inverter 401 is used to pull-down node 413 which turns ON PFET 403. PFET 403 provides the logic one drive for output 412 and thus needs to be able to turn ON quickly. PFET 403 (ChS 152) is twice as large as NFET 408 (ChS 76) to provide the equivalent drive capability for output 412. Since PFET 403 is a larger device, its gate drive (node 413) requirement is higher since its gate capacitance is higher (proportional to area). For this reason, the combination on inverter 401 with ChS 420 equal to 25/25 and NFET 402 with ChS 425 equal to 25 has an equivalent ChS of 25/12.5. The 12.5 is generated by the series combination of two NFETS (NFET in inverter 401 not shown and NFET 402) each with a ChS 25. The sizes shown are for illustration purposes and indicate relative device characteristics for driver 400. Other device sizes and ration may be used and still be within the scope of the present invention.

NFET 408 provides the logic zero drive for output 412 and thus needs to turn ON quickly to pull-down output 412. Since NFET 408 is smaller than PFET 403, its gate driver, the combination of inverter 407 and PFET 406 is correspondingly smaller. The combination of inverter 407 with ChS 425 equal to 25/6 and PFET 406 with ChS 423 equal to 25 forms an equivalent device channel size of 12.5/6 which is one half the equivalent device channel size of inverter 401 and NFET 402. The 12.5 is generated by the series combination of two PFETs (PFET in inverter 407 not shown and PFET 406) each with a channel size equal to 25.

Inverter 404 has a ChS 422 equal to 4/2 and inverter 405 has a ChS 421 equal to 8/4. Buffer/driver 400 has an input stage (parallel combination of inverters 401, 404, and 407 plus the corresponding power-gating devices NFET 402 and PFET 406) which appears as an inverter with a channel size equal to approximately 40/20. This is determined by adding 12.5 (PFET 406 and PFET of inverter 407), 4 (PFET of inverter 404), and 25 (PFET of inverter 401) for the equivalent P-channel and 12.5 (NFET 402 and NFET of inverter 401), 2 (NFET of inverter 404), and 6 (NFET of inverter 407) for the equivalent N-channel. Likewise, the output stage of buffer/driver 400 appears as an inverter with ChS 160/80 for output drive capability. This is determined by adding 152 (PFET 403) and 8 (PFET of inverter 405) for the equivalent P-channel, and 76 (NFET 408) and 4 (NFET of inverter 405) for the equivalent N-channel.

Figure 5:
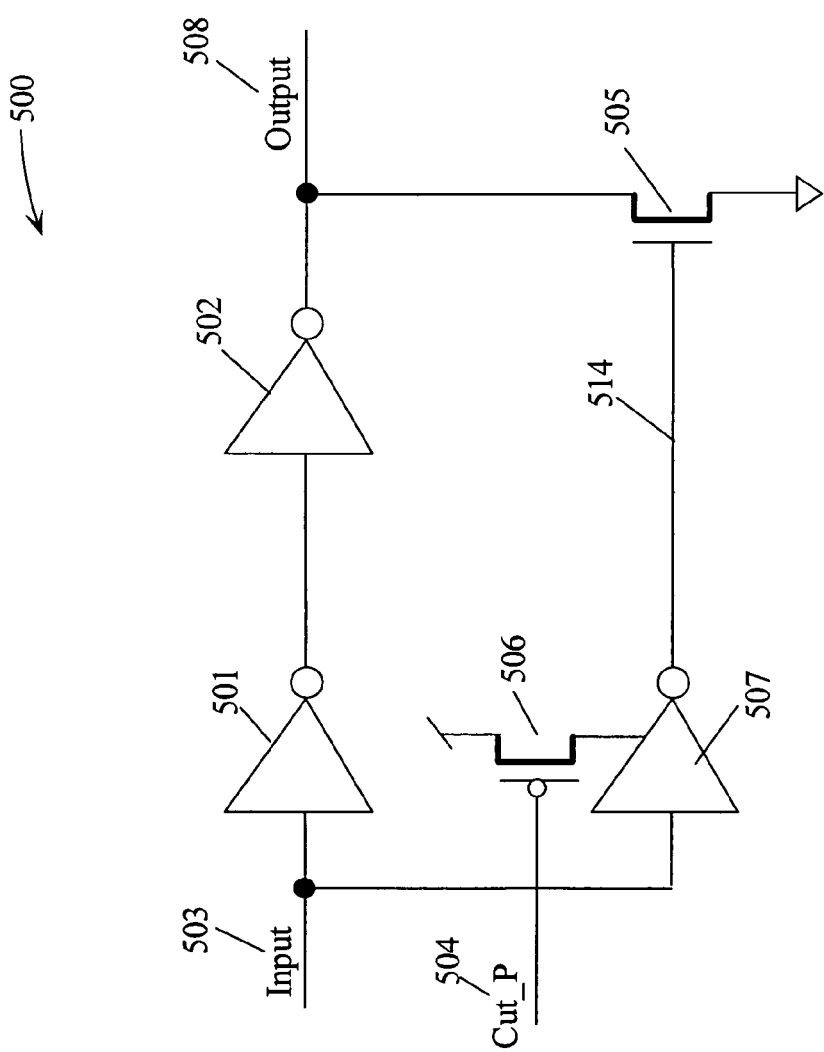
FIG. 5 is a circuit diagram of a buffer/driver according to embodiments of the present invention with a strong pull-down feature.

Sometimes it is desirable to have a buffer/driver circuit with skewed output drive capability (either the pull-up or pull-down device has more current drive capability). FIG. 5 is a circuit diagram of buffer/driver 500 with a strong pull-down according to embodiments of the present invention. Input 503 is the input to buffer/driver 500 and couples to the input of inverter 501 and inverter 507. Inverter 507 has power-gating as it provides the gate drive for large pull-down NFET 505. Since NFET 505 is a large device to provide strong pull-down drive, it also has the highest gate-leakage in the strong inversion region when its gate is at a logic one. Decoupling the positive power supply from inverter 507 allows node 514 to float to reduce the voltage stress on NFET 505 that causes gate-leakage current. Inverters 501 and 502 acts as keepers to hold the state of output 508 when Cut_P 504 is a logic one decoupling the positive power supply from inverter 507.

Figure 6:
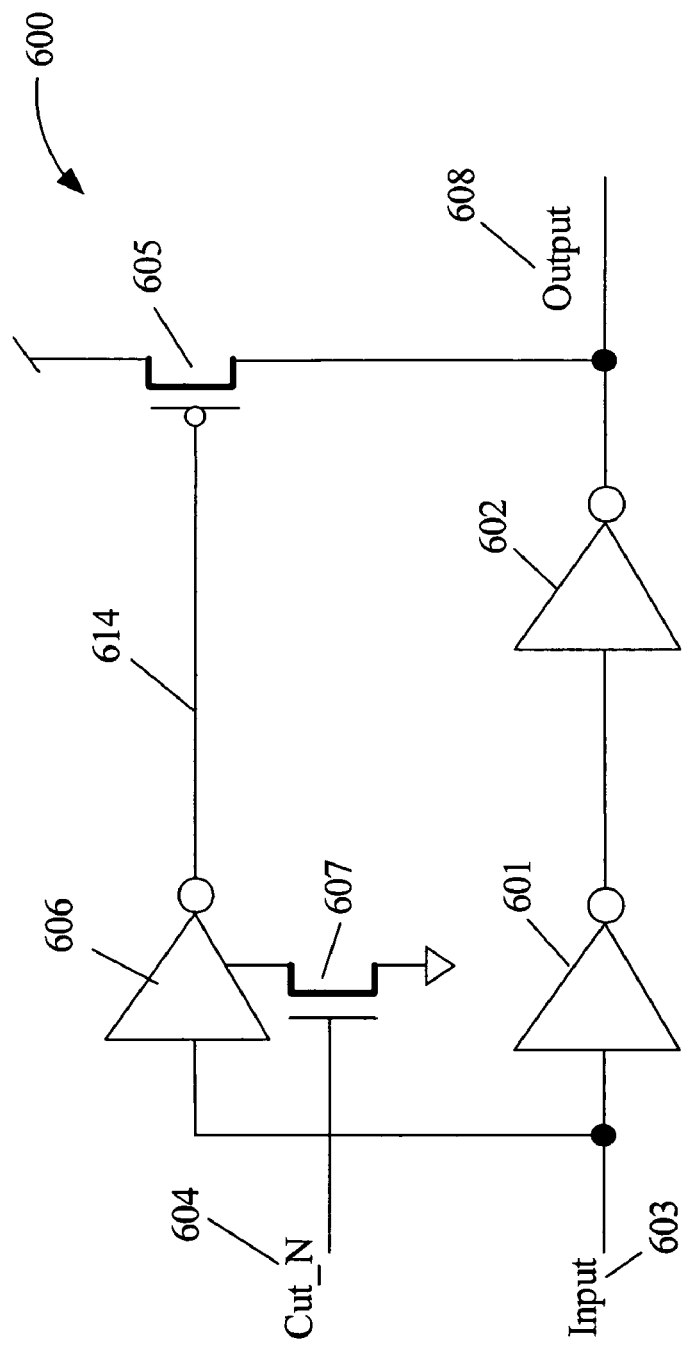
FIG. 6 is a circuit diagram of a buffer according to embodiments of the present invention with a strong pull-up feature.

FIG. 6 is a circuit diagram of buffer/driver 600 with a strong pull-up according to embodiments of the present invention. Input 603 is the input to buffer/driver 600 and couples to the input of inverter 601 and inverter 607. Inverter 607 has power-gating as it provides the gate drive for large pull-down PFET 605. Since PFET 605 is a large device to provide strong pull-up drive, it also has the highest gate-leakage in the strong inversion region when its gate is a logic zero. Decoupling the positive power supply from inverter 607 allows node 614 to float to reduce the voltage stress on PFET 605. Inverters 601 and 602 acts as keepers to hold the state of output 608 when Cut_N 604 is a logic zero decoupling the negative power supply from inverter 607.

Figure 7:
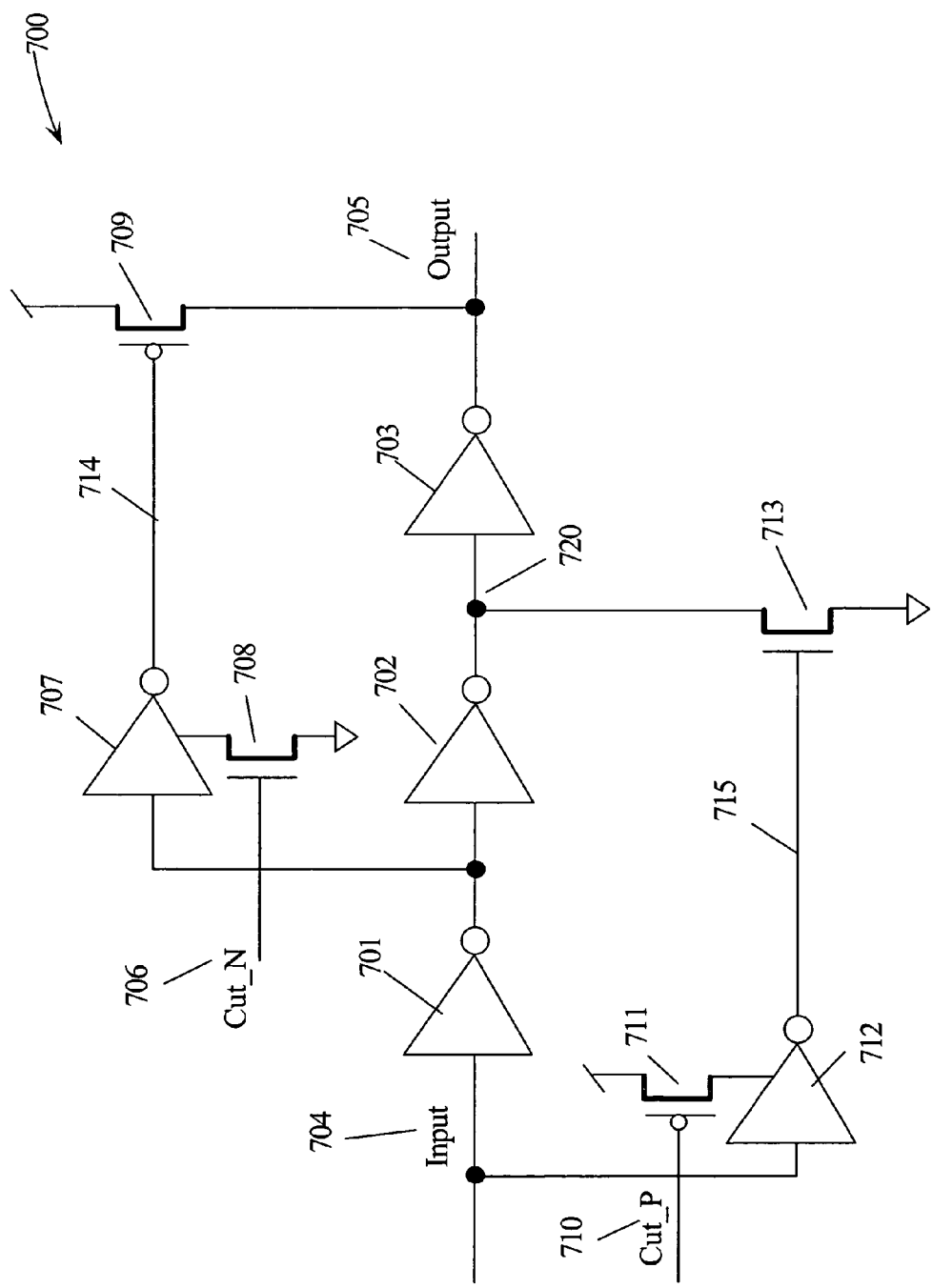
FIG. 7 is a circuit diagram of another embodiment of the present invention with more that two stages in the buffer/driver circuit.

FIG. 7 is a circuit diagram of a buffer/driver circuit 700 comprising an odd number of logic inverters (in this case three). The keeper logic path is formed by the series connection of inverters 701–703 between input 704 and output 705. Buffer/driver 700 is configured with a strong pull-up through PFET 709. Since output 705 is pulled-up quickly with PFET 709, it is desirable to turn OFF inverter 703 quickly also. By providing a strong pull-down to the input of inverter 703 with NFET 713, the output of inverter 703 is driven to a logic one at the same time PFET 709 is driving output 705 to a logic one. Inverter 707 and inverter 710 drive large PFET 709 and large NFET 713, respectively, both of these devices are power-gated. Inverter 707 is power-gated with NFET 708 via control signal Cut_N 706 and inverter 712 is power-gated by PFET 710 via control signal Cut_P 710.

Figure 8:
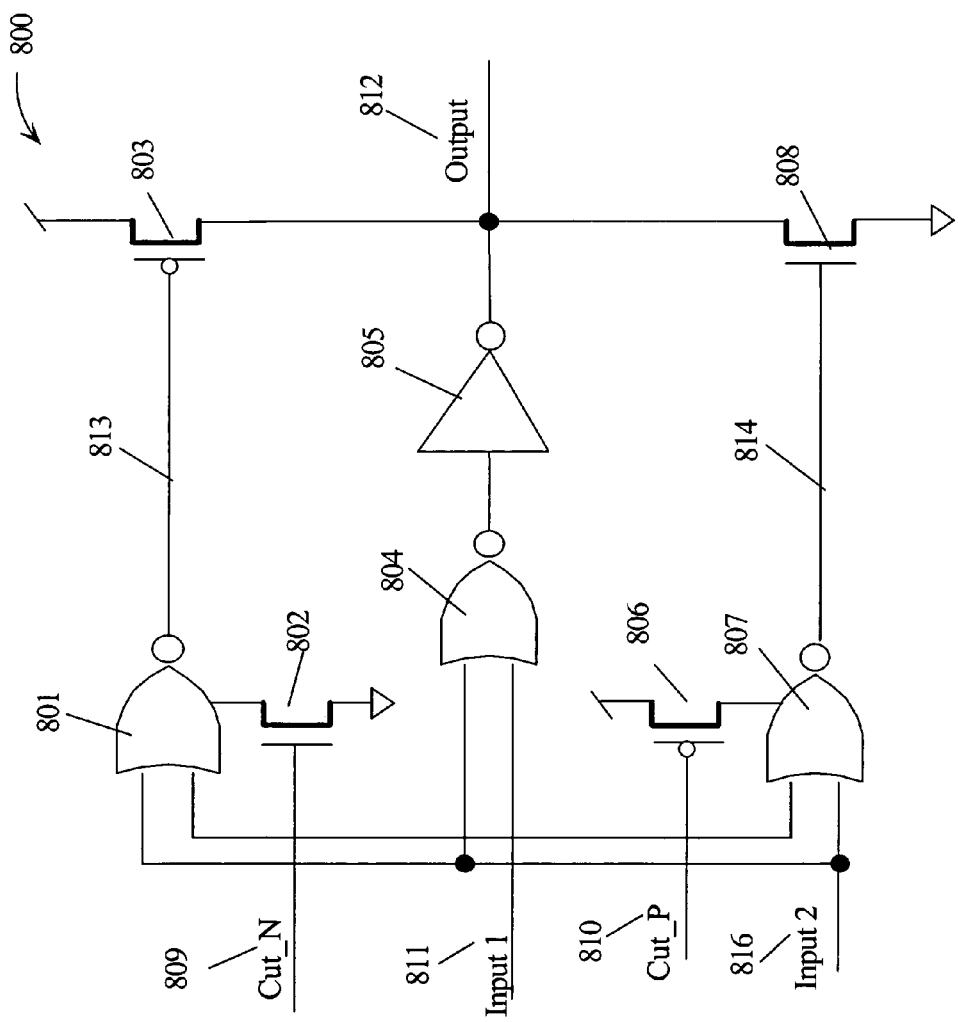
FIG. 8 is a circuit diagram of a buffer/driver circuit with a multi-input logic input stage.

FIG. 8 is a circuit diagram illustrating that other circuit configurations are possible using embodiments of the present invention. Buffer/driver 800 illustrates an input stage that comprises a two input NOR. The keeper path is formed by NOR gate 804 and inverter 805 coupled between inputs 811 and 816 and output 812. The power-gated stages for output devices PFET 803 and NFET 808 are also two input NOR logic gates. NOR 801 is power-gated by NFET 802 via control signals Cut_N 809. Likewise, NOR 807 is power-gated by PFET 806 via control signal Cut_P 810. Power-gating NOR logic gates 801 and 807 float nodes 813 and 814 reducing the stress on output devices PFET 803 and NFET 808. NOR 804 and inverter 805 hold (keep) the logic state of output 812 when NORS 801 and 807 are power-gated. The input stage of buffer/driver 800 comprising a two input NOR is for illustration only. Other logic configurations for the input stage of buffer/driver 800 may be used and are considered within the scope of the present invention.

Figure 9:
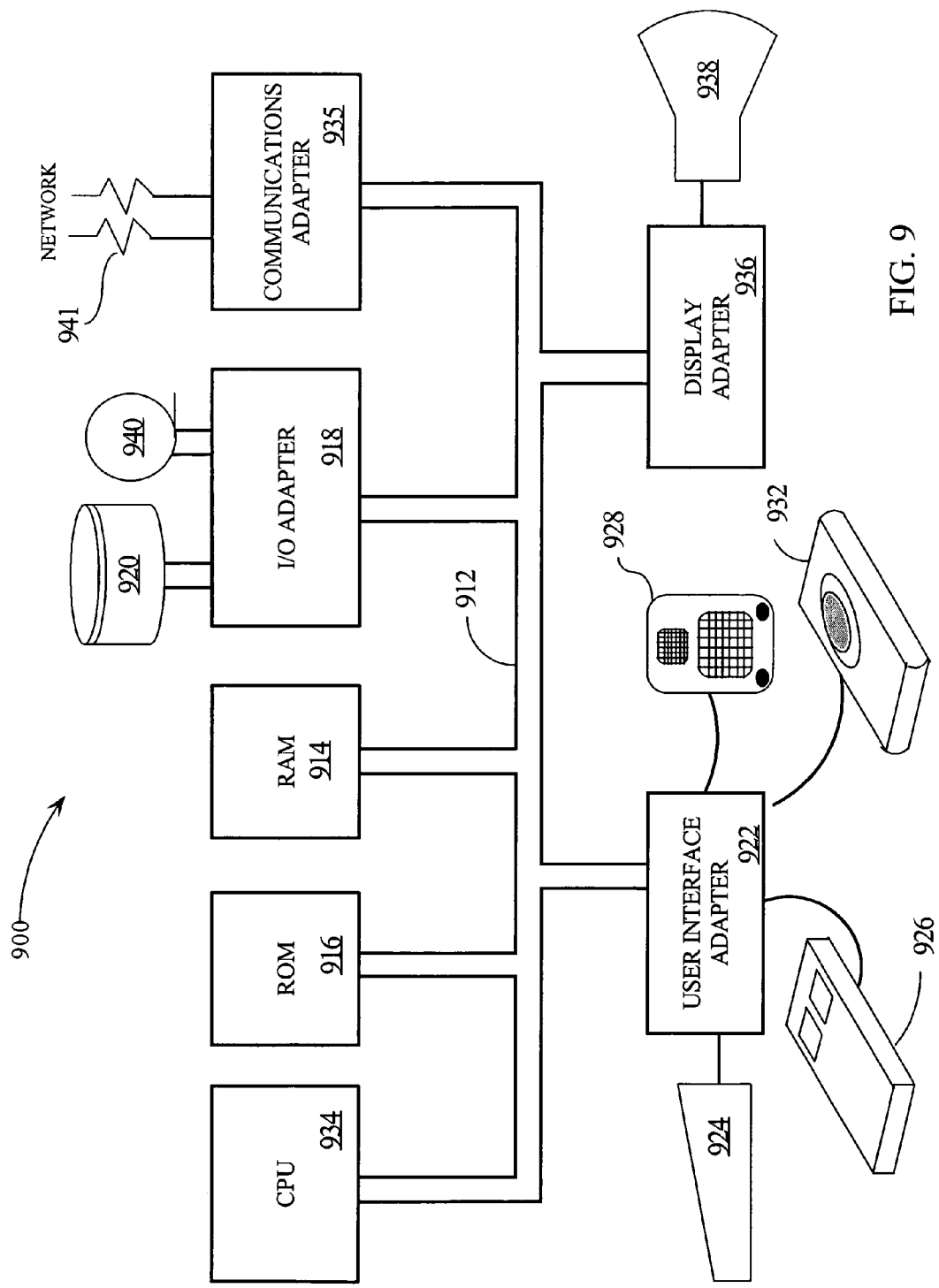
FIG. 9 is a data processing system suitable for practicing embodiments of the present invention.

FIG. 9 is a high level functional block diagram of a representative data processing system 900 suitable for practicing the principles of the present invention. Data processing system 900 includes a central processing system (CPU) 910 operating in conjunction with a system bus 912. System bus 912 operates in accordance with a standard bus protocol, such as the ISA protocol, compatible with CPU 910. CPU 910 operates in conjunction with electronically erasable programmable read-only memory (EEPROM) 916 and random access memory (RAM) 914. Among other things, EEPROM 916 supports storage of the Basic Input Output System (BIOS) data and recovery code. RAM 914 includes, DRAM (Dynamic Random Access Memory) system memory and SRAM (Static Random Access Memory) external cache. I/O Adapter 918 allows for an interconnection between the devices on system bus 912 and external peripherals, such as mass storage devices (e.g., a hard drive, floppy drive or CD/ROM drive), or a printer 940. A peripheral device 920 is, for example, coupled to a peripheral control interface (PCI) bus, and I/O adapter 918 therefore may be a PCI bus bridge. User interface adapter 922 couples various user input devices, such as a keyboard 924 or mouse 926 to the processing devices on bus 912. Display 938 which may be, for example, a cathode ray tube (CRT), liquid crystal display (LCD) or similar conventional display units. Display adapter 936 may include, among other things, a conventional display controller and frame buffer memory. Data processing system 900 may be selectively coupled to a computer or telecommunications network 941 through communications adapter 934. Communications adapter 934 may include, for example, a modem for connection to a telecom network and/or hardware and software for connecting to a computer network such as a local area network (LAN) or a wide area network (WAN). CPU 910 and other components of data processing system 900 may contain a logic circuitry employing buffer/driver circuits according to embodiments of the present invention for controlling gate-leakage currents.

What is claimed is:

1. A buffer/driver circuit having one or more inputs and an output for driving a load comprising:
    a first logic circuit path having one or more buffer inputs and a buffer output; and
    a second logic circuit path receiving the one or more buffer inputs and generating a first logic output coupled to the buffer output, wherein the first logic output enhances a current drive capability of a first logic state of the buffer output in response to a first logic combination of the one or more buffer inputs and a first logic state of a first control signal, and a first power supply voltage is coupled to the second logic path by a first electronic switch in response to the first logic state of the first control signal and decoupled from the second logic path in response to a second logic state of the first control signal.

2. The buffer/driver circuit of claim 1 further comprising a third logic circuit path receiving the one or more buffer inputs and generating a second logic output coupled to the buffer output, wherein the second logic output enhances a current drive capability of a second logic state of the buffer output in response to a second logic combination of the one or more buffer inputs and a second logic state of a second control signal and a second power supply voltage is coupled to the third logic path by a second electronic switch in response to the second logic state of the second control signal and decoupled from the third logic path in response to the first logic state of the second control signal.

3. The buffer/driver circuit of claim 1, wherein the first logic path comprises:
    a first logic circuit receiving the one or more buffer inputs and generating an intermediate logic output as a logic combination of the one or buffer inputs; and
    an inverter having an input coupled to the intermediate logic output and an output forming the first logic output.

4. The buffer/driver circuit of claim 3, wherein the second logic circuit path comprises:
    a first power-gated logic circuit having a positive power supply node coupled to the second power supply voltage, a negative power supply node, one or more logic inputs coupled to the buffer inputs, and an intermediate logic output generating the first logic state in response to a logic combination of logic states of the one or more logic inputs and generating the second logic state at the intermediate logic output in response to the first logic combination of the logic states of the one or more buffer inputs and the first logic state of the first control signal, wherein the first electronic switch has a first node coupled to the first power supply voltage, a second node coupled to the negative power supply node, and a control input coupled to the first control signal; and
    a power PFET having a gate coupled to the intermediate logic output of the first power-gated logic circuit, a source coupled to a second power supply voltage and a drain forming the first logic output.

5. The buffer/driver circuit of claim 2, wherein the third logic path comprises:
    a second power-gated logic circuit having a negative power supply node coupled to the first power supply voltage, a positive power supply node, one or more logic inputs coupled to the buffer inputs, and an intermediate logic output generating the second logic state in response to the logic combination of logic states of the one or more logic inputs and generating the first logic state at the intermediate logic output in response to the first logic combination of the logic states of the one or more buffer inputs and the second logic state of the second control signal, wherein the second electronic switch has a first node coupled to the second power supply voltage, a second node coupled to the negative power supply node, and a control input coupled to the second control signal; and a power NFET having a gate coupled to the intermediate logic output of the second power-gated logic circuit, a source coupled to the first power supply voltage and a drain forming the second logic output.

6. The buffer/driver circuit of claim 4, wherein the first electronic switch comprises an NFET having a source coupled to the first node, a gate coupled to the first control signal and a drain coupled to the second node, wherein the NFET couples the first power supply voltage to the first power-gated logic circuit in response to the first logic state of the first control signal.

7. The buffer/driver circuit of claim 5, wherein the second electronic switch comprises a PFET having a source coupled to the first node, a gate coupled to the second control signal, and a drain coupled to the second node, wherein the PFET couples the second power supply voltage to the second power-gated logic circuit in response to the second logic state of the second control signal.

8. A buffer/driver circuit having one or more buffer inputs and a buffer output for driving a load comprising:
   a first logic circuit path having one or more inputs coupled to the buffer inputs, a first output, a first buffer output, and a second buffer output;
   a second logic circuit path receiving one or more buffer inputs and generating a first logic output coupled to the first buffer output, wherein the first logic output enhances a current drive capability of a first logic state of the first buffer output in response to a first logic combination of the one or more buffer inputs and a first logic state of a first control signal, and a first power supply voltage is coupled to the second logic circuit path by a first electronic switch in response to the first logic state of the first control signal and decoupled from the second logic circuit path in response to a second logic state of the first control signal; and
   a third logic circuit path receiving the first output and generating a second logic output coupled to the second buffer output, wherein the second logic output enhances a current drive capability of a second logic state of the second buffer output in response to the first logic combination of the one or more buffer inputs and a second logic state of a second control signal, and a second power supply voltage is coupled to the third logic circuit path by a second electronic switch in response to the second logic state of the second control signal and decoupled from the third logic circuit path in response to the first logic state of the second control signal.

9. A data processing system comprising:
   a central processing unit (CPU);
   a random access memory (RAM);
   an input output (I/O) interface unit; and
   a bus for coupling the CPU, RAM and I/O interface unit, wherein the CPU has a buffer/driver circuit having a first logic circuit path with one or more buffer inputs and a buffer output, a second logic circuit path receiving the one or more buffer inputs and generating a first logic output coupled to the buffer output, wherein the first logic output enhances a current drive capability of a first logic state of the buffer output in response to a first logic combination of the one or more buffer inputs and a first logic state of a first control signal, and a first power supply voltage is coupled to the second logic path by a first electronic switch in response to the first logic state of the first control signal and decoupled from the second logic path in response to a second logic state of the first control signal.

10. The data processing system of claim 9 further comprising a third logic circuit path receiving the one or more buffer inputs and generating a second logic output coupled to the buffer output, wherein the second logic output enhances a current drive capability of a second logic state of the buffer output in response to a second logic combination of the one or more buffer inputs and a second logic state of a second control signal and a second power supply voltage is coupled to the third logic path by a second electronic switch in response to the second logic state of the second control signal and decoupled from the third logic path in response to the first logic state of the second control signal.

11. The data processing system of claim 9, wherein the first logic path comprises:
   a first logic circuit receiving the one or more buffer inputs and generating an intermediate logic output as a logic combination of the one or buffer inputs; and
   an inverter having an input coupled to the intermediate logic output and an output forming the first logic output.

12. The data processing system of claim 11, wherein the second logic circuit path comprises:
   a first power-gated logic circuit having a positive power supply node coupled to the second power supply voltage, a negative power supply node, one or more logic inputs coupled to the buffer inputs, and an intermediate logic output generating the first logic state in response to a logic combination of logic states of the one or more logic inputs and generating the second logic state at the intermediate logic output in response to the first logic combination of the logic states of the one or more buffer inputs and the first logic state of the first control signal, wherein the first electronic switch has a first node coupled to the first power supply voltage, a second node coupled to the negative power supply node, and a control input coupled to the first control signal; and
   a power PFET having a gate coupled to the intermediate logic output of the first power-gated logic circuit, a source coupled to a second power supply voltage and a drain forming the first logic output.

13. The data processing system of claim 10, wherein the third logic path comprises:
   a second power-gated logic circuit having a negative power supply node coupled to the first power supply voltage, a positive power supply node, one or more logic inputs coupled to the buffer inputs, and an intermediate logic output generating the second logic state in response to the logic combination of logic states of the one or more logic inputs and generating the first logic state at the intermediate logic output in response to the first logic combination of the logic states of the one or more buffer inputs and the second logic state of the second control signal, wherein the second electronic switch has a first node coupled to the second power supply voltage, a second node coupled to the negative power supply node, and a control input coupled to the second control signal; and
   a power NFET having a gate coupled to the intermediate logic output of the second power-gated logic circuit, a source coupled to the first power supply voltage and a drain forming the second logic output.

14. The data processing system of claim 12, wherein the first electronic switch comprises an NFET having a source coupled to the first node, a gate coupled to the first control signal and a drain coupled to the second node, wherein the NFET couples the first power supply voltage to the first power-gated logic circuit in response to the first logic state of the first control signal.

15. The data processing system of claim 13, wherein the second electronic switch comprises a PFET having a source coupled to the first node, a gate coupled to the second control signal, and a drain coupled to the second node, wherein the PFET couples the second power supply voltage to the second power-gated logic circuit in response to the second logic state of the second control signal.

16. A data processing system comprising:
   a central processing unit (CPU);
   a random access memory (RAM);
   an input output (I/O) interface unit;
   a bus for coupling the CPU, RAM and I/O interface unit, wherein the CPU has a buffer/driver circuit having a first logic circuit path having one or more inputs coupled to the buffer inputs, a first output, a first buffer output, and a second buffer output, a second logic circuit path receiving one or more buffer inputs and generating a first logic output coupled to the first buffer output, wherein the first logic output enhances a current drive capability of a first logic state of the first buffer output in response to a first logic combination of the one or more buffer inputs and a first logic state of a first control signal, and a first power supply voltage is coupled to the second logic circuit path by a first electronic switch in response to the first logic state of the first control signal and decoupled from the second logic circuit path in response to a second logic state of the first control signal, and a third logic circuit path receiving the first output and generating a second logic output coupled to the second buffer output, wherein the second logic output enhances a current drive capability of a second logic state of the second buffer output in response to the first logic combination of the one or more buffer inputs and a second logic state of a second control signal, and a second power supply voltage is coupled to the third logic circuit path by a second electronic switch in response to the second logic state of the second control signal and decoupled from the third logic circuit path in response to the first logic state of the second control signal.

* * * * *